United States Patent
Tsai et al.

(10) Patent No.: US 8,183,759 B2
(45) Date of Patent: May 22, 2012

(54) LIGHT EMITTING DIODE DEVICE AND MANUFACTURING METHOD THEREOF

(75) Inventors: Tzeng-Guang Tsai, Hsinchu County (TW); Jia-Min Shieh, Hsinchu (TW); Chih-Chiang Kao, Kaohsiung (TW); Hung-Yuan Su, Taipei (TW)

(73) Assignees: Silitek Electronic (Guangzhou) Co., Ltd., Guangzhou (CN); Lite-On Technology Corporation, Taipei (TW)

( * ) Notice: Subject to any disclaimer, the term of this patent is extended or adjusted under 35 U.S.C. 154(b) by 456 days.

(21) Appl. No.: 12/422,308

(22) Filed: Apr. 13, 2009

(65) Prior Publication Data

US 2010/0079061 A1     Apr. 1, 2010

(30) Foreign Application Priority Data

Oct. 1, 2008 (TW) ................................. 97137673 A

(51) Int. Cl.
*H01L 51/00* (2006.01)
(52) U.S. Cl. ........................................ 313/486; 313/498
(58) Field of Classification Search ............ 313/498–512
See application file for complete search history.

(56) References Cited

U.S. PATENT DOCUMENTS

2008/0268248 A1* 10/2008 Jang et al. ..................... 428/403
2009/0127576 A1*  5/2009 Jang et al. ....................... 257/98

* cited by examiner

*Primary Examiner* — Anne Hines
(74) *Attorney, Agent, or Firm* — Li & Cai Intellectual Property (USA) Office

(57) ABSTRACT

A manufacturing method of an LED device includes the following steps. First, a substrate and at least one LED disposed on the substrate are provided. Next, a porous material layer having a plurality of pores is formed on a surface of the LED. Finally, a plurality of nanocrystals are formed in the pores to construct a phosphor layer on the surface of the LED.

8 Claims, 11 Drawing Sheets

LIGHT EMITTING DIODE DEVICE AND MANUFACTURING METHOD THEREOF

BACKGROUND OF THE INVENTION

1. Field of the Invention

The present invention relates to a light emitting diode (LED) device and a manufacturing method thereof, and more particularly, to a manufacturing method that includes forming a porous material layer on an LED and disposing each pore in the porous material layer with nanocrystals, and an LED device having the nanocrystals manufactured according to the manufacturing method.

2. Description of the Prior Art

In general, a white LED device utilizes an LED to excite a specific phosphor material, and then mix light from both LED and phosphor material to achieve white light. However, particles sizes of the phosphor material is several micrometers, incident visible light may be shielded and scattered by phosphor powders and the luminous efficiency of the white LED device will be reduced. In order to improve this problem, a combination of an LED and nanoscale phosphor powders is utilized. Although the combination of an LED and nanoscale phosphor powders can improve the light-scattering problem, nanoscale quantum dots might tend to cluster together due to the characteristic of the nanoparticles. In the other hands, the nanoscale quantum dots will have different sizes and distribute unequally non-uniformly in the solution.

Therefore, raising the color uniformity of the LED device and the luminous efficiency are objectives that the industry aims to keep improving.

SUMMARY OF THE INVENTION

It is therefore a primary objective of the present invention to provide an LED device and a manufacturing method thereof so as to efficiently reduce light scattering effect to enhance the efficiency of LEDs using nanocrystal and raise uniformity of the nanocrystals.

The present invention forms the porous material layer with regular arrangement on the LED, and disposes the pores of the porous material layer with the nanocrystals so as to control the uniformity of the nanocrystals distributed in the phosphor layer. Therefore, the white light or the light of other colors formed by mixing the light emission from the LED and the nanocrystals can be uniform. With this technology, even to fabricate the white light emitting device with several chips or a chip array, the color quality can be believed to be very well.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
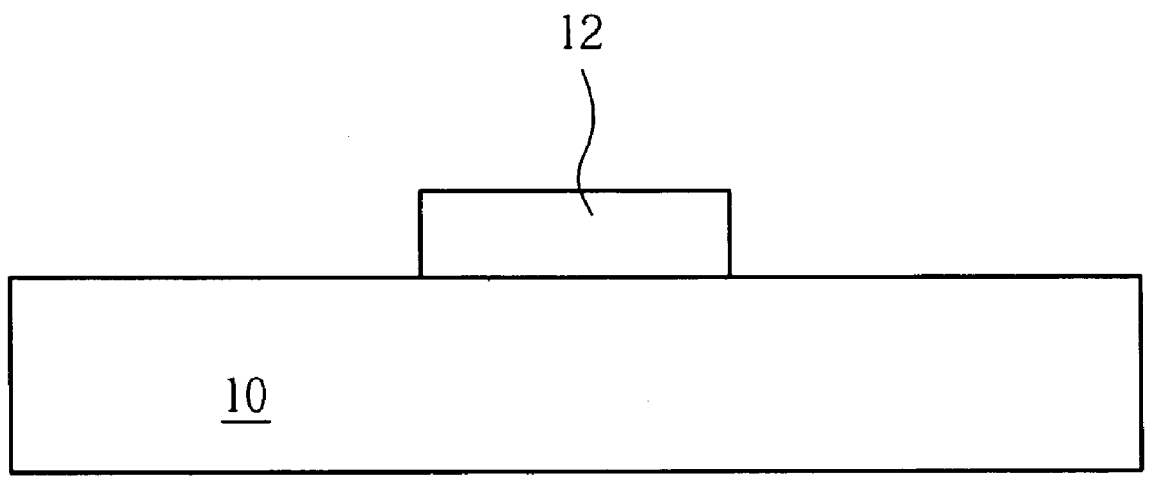
FIG. 1 through FIG. 4 are schematic diagrams illustrating a manufacturing method of an LED device according to a first preferred embodiment of the present invention.
Figure 2:
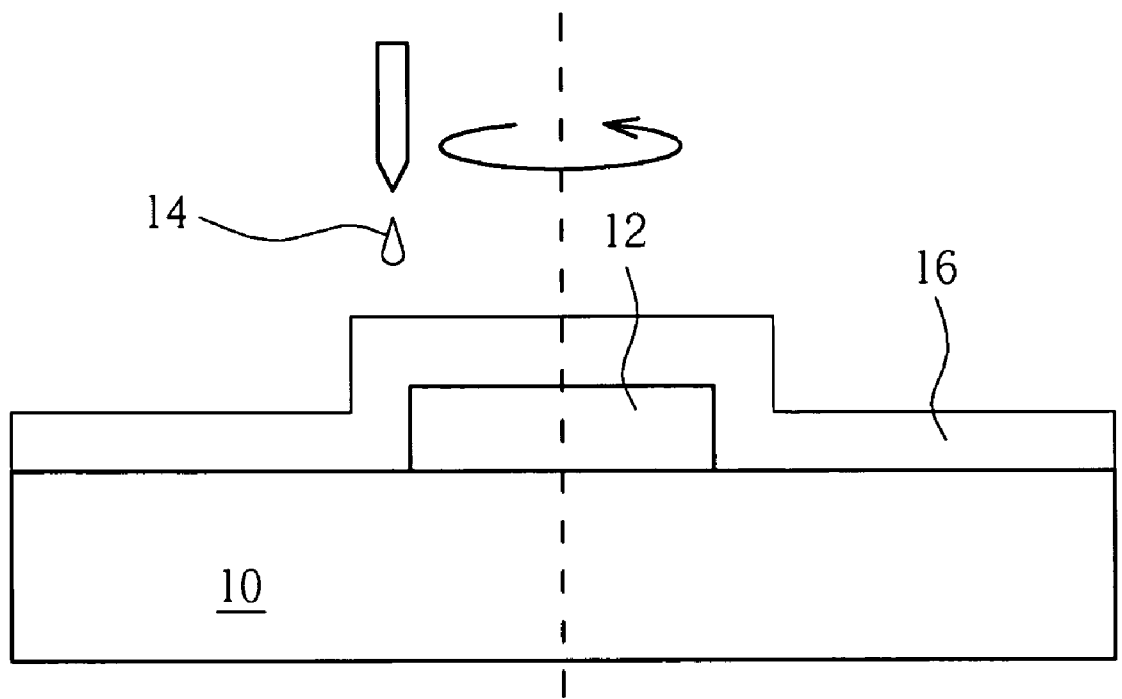
Figure 3:
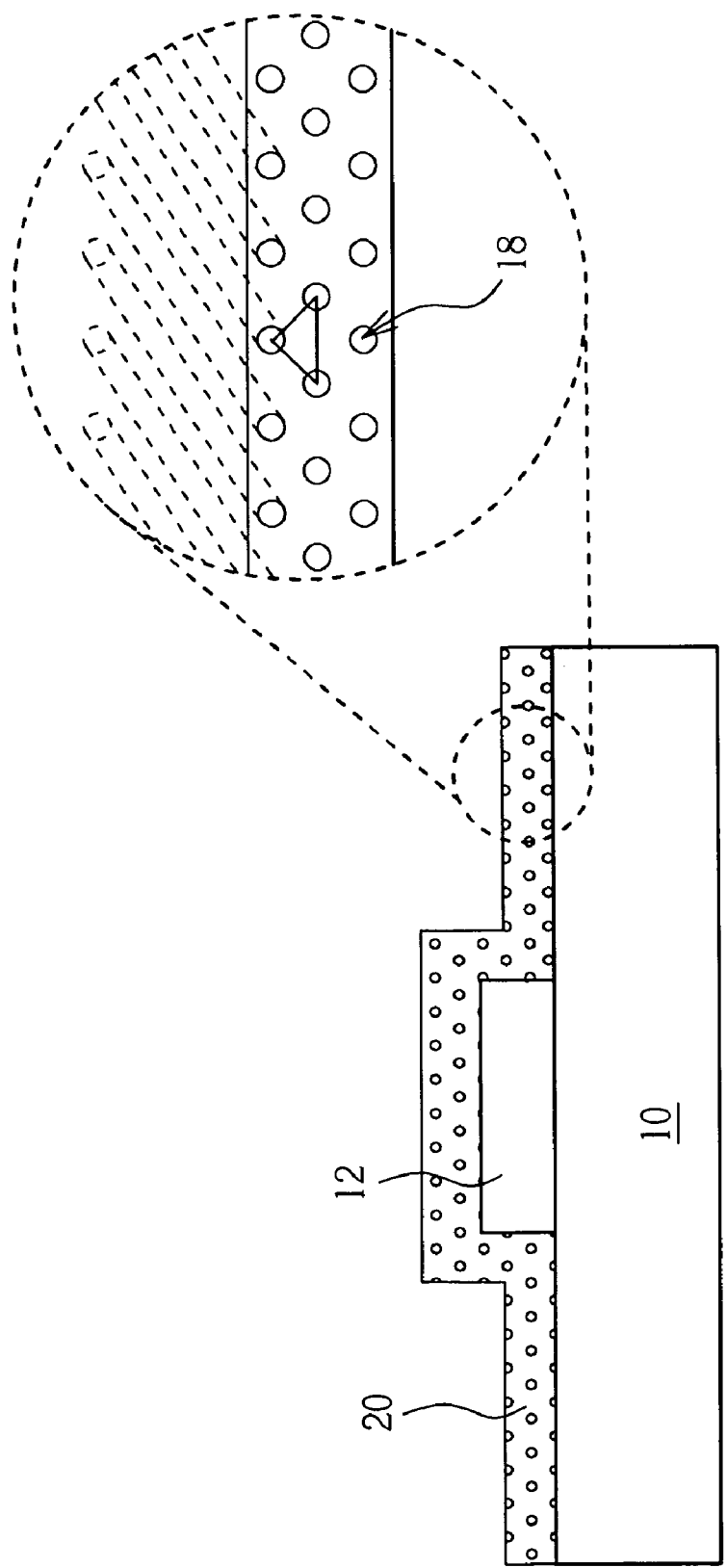
Figure 4:
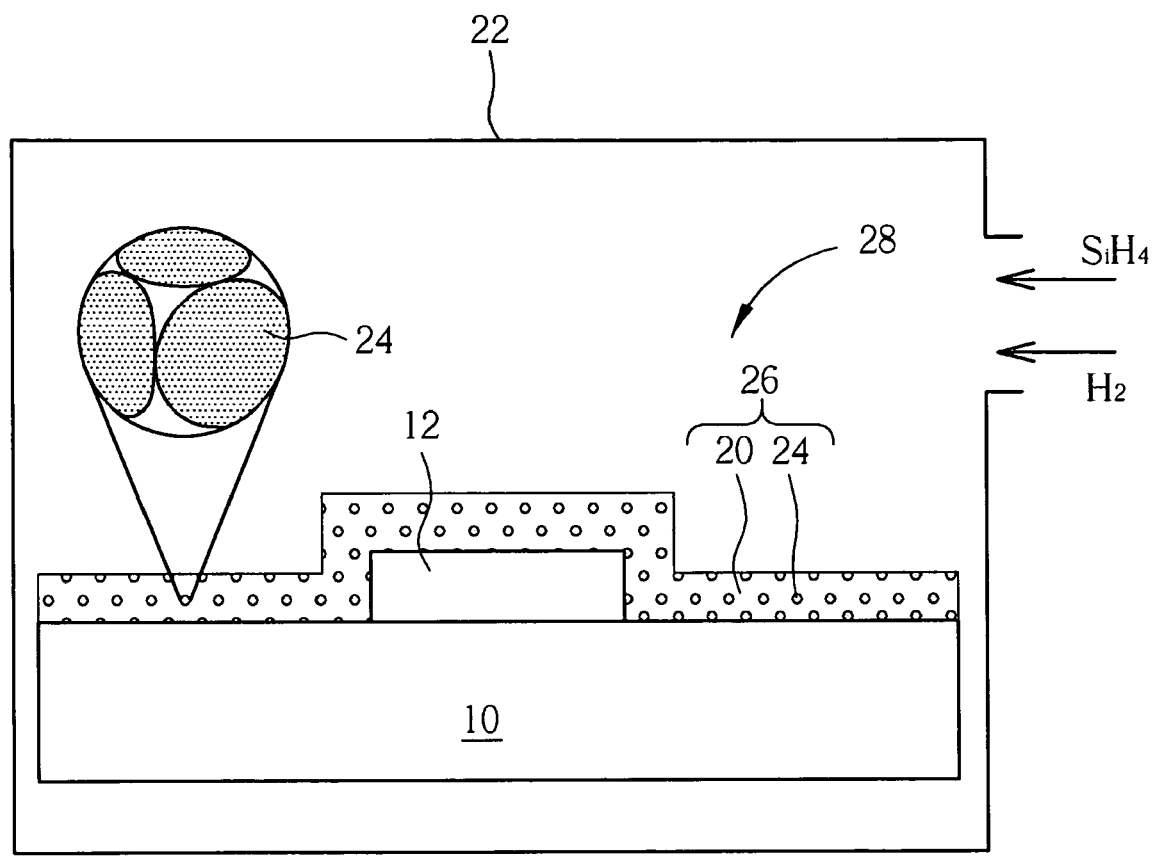

Please refer to FIG. 1 through FIG. 4. FIGS. 1 through 4 are schematic diagrams illustrating a manufacturing method of an LED device according to a first preferred embodiment of the present invention. FIG. 4 is a cross-sectional diagram illustrating an LED device according to a first preferred embodiment of the present invention. As shown in FIG. 1, the manufacturing method of the LED device of the present invention first provides a substrate 10 and at least one LED 12 disposed on the substrate 10. The substrate 10 can be a substrate, such as a circuit board, leadframe or silicon substrate etc., used for different purposes so as to hold the LED 12, but is not limited to these purposes. The LED 12 can also be an LED chip on a wafer without being cut, and the substrate 10 can also be a holder or a carrier used to perform following processes for the LED 12 on the wafer. In addition, the light emitted by the LED 12 can be any kind of color, and the wavelength of the light emitted by the LED 12 is preferably between 380 nanometers and 500 nanometers, such as InGaN LED, but is not limited to this.

Next, as shown in FIG. 2, a colloidal solution 14 is provided, and then, the colloidal solution 14 is disposed on the LED 12 to form a colloidal film 16 on the LED 12. The colloidal solution 14 can be prepared by the following steps before being disposed on the LED 12. First, a sol-gel method can be performed to mix a plurality of inorganic materials and a plurality of organic materials so as to provide a mixing solution with at least one of the organic materials. Then, the mixing solution is heated to a first temperature and kept it in a first process time, wherein the first process temperature is higher, the first process time is shorter. Furthermore, the relationship of the first process temperature and the first process time is depended on the characteristic of inorganic materials and organic materials. In addition, the first process temperature is substantially between 50 degrees centigrade (° C.) and 150° C., and 60° C. to 90° C. preferred; and the duration of this process (the first predetermined process time) is substantially between 10 minutes and 150 minutes, and 60 to 120 minutes preferred. Thereafter, an aging process is performed to arrange the mixing solution in an ambient temperature (such as room temperature) lower than the heating temperature (the first process temperature) and the duration of this aging process is substantially between 2 hours and 7 hours. At this point, the colloidal solution 14 is completed.

In this embodiment, the inorganic materials include water, hydrochloric acid (HCl), ethanol and tetraethylorthosilicate (TEOS), and the organic material includes cetyltrimethylammonium bromide (CTAB), polyoxyethylene cetyl ether (Brij-56) and triblock copolymer pluronic P-123 (P123). The mole ratio of TEOS:P123,CTAB,Brij-56:water:HCl:ethanol is substantially 1:0.008~0.03:3.5~5:0.003~0.03:10~34. The present invention is not limited to these materials and the mole ratio. In addition, as shown in FIG. 2, in this embodiment, the colloidal solution 14 is disposed on the LED 12 by utilizing the spin-coating method (as indicated by the arrow 5 shown in FIG. 2). The spin rate is substantially 2200 revolutions per minute (rpm), and the duration of the spin-coating method is about 30 seconds. The present invention is not limited to this condition, and the spin rate and the duration can be determined according to the required uniformity and the required thickness of the colloidal film 16. Similarly, the coating method of the present invention is not limited to the spin-coating method, and the coating method can also be methods such as spraying method, screen printing method and molding method that can coat liquid or fluid uniformly. Furthermore, the step of disposing the colloidal solution 14 on the LED 12 further includes a step of controlling the thickness of the colloidal solution 14 on the LED 12, and the thickness of the colloidal solution 14 on the LED 14 as the colloidal film 16 is controlled less than 300 nanometers and preferably substantially no more than 200 nanometers.

The pad (not shown in the figure) of the LED 12 of this embodiment is electrically connected to the electrode (not shown in the figure) on the substrate 10 by an electrical connecting method, such as a flip-chip method or an eutectic bonding method etc., which does not require extra metal wires, but is not limited to these methods. The pad of the LED 12 can also be electrically connected to the electrode of the substrate 10 through metal wires by a wire bonding method before disposing the colloidal solution 14 on the LED 12.

Then, as shown in FIG. 3, a drying process is performed to make the colloidal solution 14 be a first porous material layer 20, wherein the drying process includes a drying step and a baking step. For example, the LED 12 with the colloidal film 16 is put at a temperature between 25° C. and 60° C. during the drying step, and the duration of the drying step is substantially between 2 hours and 7 hours. Next, a baking step is performed, wherein the temperature of the baking step is substantially between 90° C. and 150° C., and the duration of the baking step is substantially between 1 hour and 5 hours. Accordingly, solvent in the colloidal film 16 can be removed to form the first porous material layer 20 with a plurality of first pores on the LED 12. In addition, a drying step may be performed before the baking step due to process controlled and uniformity. In the other hand, the LED 12 with the colloidal film 16 will be put at a temperature between 25° C. and 60° C. firstly, and the duration of the drying step is preferred between 2 hours and 7 hours. Furthermore, the total process time of the drying process substantially between 1 hour and 10 hours.

Figure 5:
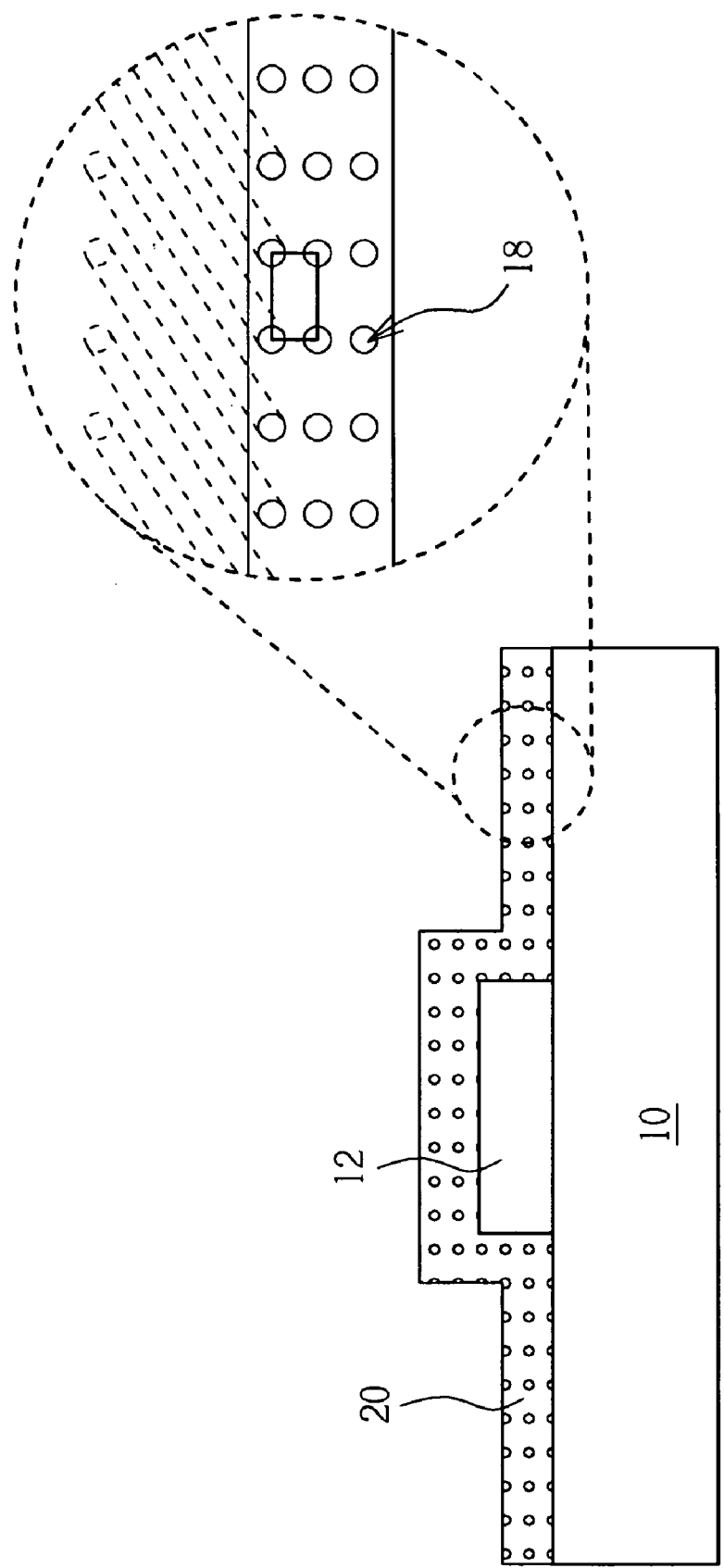
FIG. 5 is a schematic diagram illustrating a vertical cross-section of the first pores of the present invention being disposed in a rectangular formation.

The material of the first porous material layer 20 includes silicon oxide with low permeability and high stability, such as silicon dioxide or silica, etc. When the wavelength of the light passing through the first porous material layer 20 is between 400 nanometers and 700 nanometers, the transmittance of the first porous material layer 20 is larger than 90%. It should be noted that the aperture of each of the first pores 18 of this embodiment can be adjusted by controlling the duration and the temperature of the drying step and the baking step, and the aperture of each of the first pores 18 is smaller than 200 nanometers. In addition, refer to FIGS. 3 & 5, the shape of each of the first pores 18 is preferably pillar-shaped, and the first pores 18 are parallel to a surface of the LED 12. The vertical cross-section of the first pores 18 is preferably a special formation arranged in order, such as a triangular formation, a quadrangle formation, such as square and rectangular and a polygon formation but is not limited to this formation. Also refer to FIG. 3, any three neighbor first pores 18 with similar size are placed as a regular triangle formation.

Next, as shown in FIG. 4, a high-density-plasma chemical-vapor-deposition (HDPCVD) process is performed. During the HDPCVD process, silane and hydrogen are injected into the deposition chamber 22 used for the HDPCVD process. A plurality of first nanocrystals 24 are respectively formed in the first pores 18 by the HDPCVD process so as to construct a first phosphor layer 26 composed of the first porous material layer 20 and the first nanocrystals 24. The temperature of the HDPCVD process is between 100° C. and 500° C., and the pressure of the HDPCVD process is between 5 mTorr and 50 mTorr. The power for generating plasma is between 100 watts and 500 watts. In addition, hydrogen is injected into the deposition chamber 22 continuously, and silane is injected into the deposition chamber 22 intermittently. The duration of stopping injecting the silane and the duration of injecting the silane are, respectively, between 1 second and 5 seconds and between 0.5 second and 3 seconds, and the silane is injected by repeating the steps of stopping injecting the silane and injecting the silane by turns. The first nanocrystals 24 can therefore be formed in each of the first pores 18 of the first porous material layer 20. In addition, the thickness of the first porous material layer 20 of this embodiment is less than 300 nanometers; and preferably no more than 200 nanometers. When the thickness of the first porous material layer 20 is well controlled, gases injected in the HDPCVD process can enter each of the first pores 18 of the first porous material layer 20 through the structure interstice in the first porous material layer 20 easily so as to form the first nanocrystals 24 in each of the first pores 18. The present invention is not limited to a certain thickness; the thickness of the first porous material layer 20 is determined by the condition of the gases being able to fill all first pores 18. Furthermore, the number of the first nanocrystals 24 formed in the first porous material layer 20 can be controlled by adjusting the thickness of the first porous material layer 20.

Figure 6:
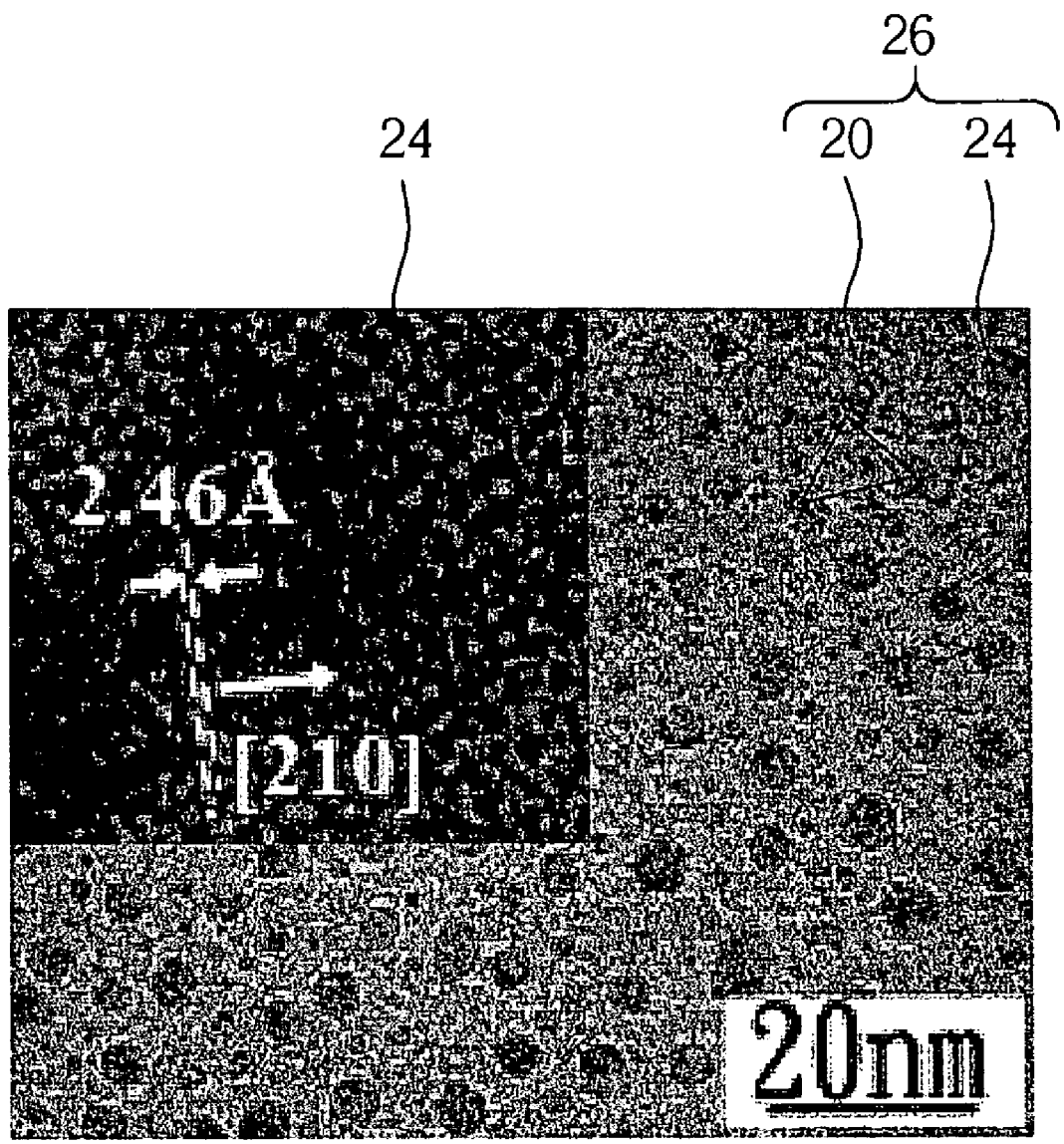
FIG. 6 is a diagram illustrating a cross-sectional image of the first phosphor layer of the present invention pictured by transmission electron microscopy (TEM).
Figure 7:
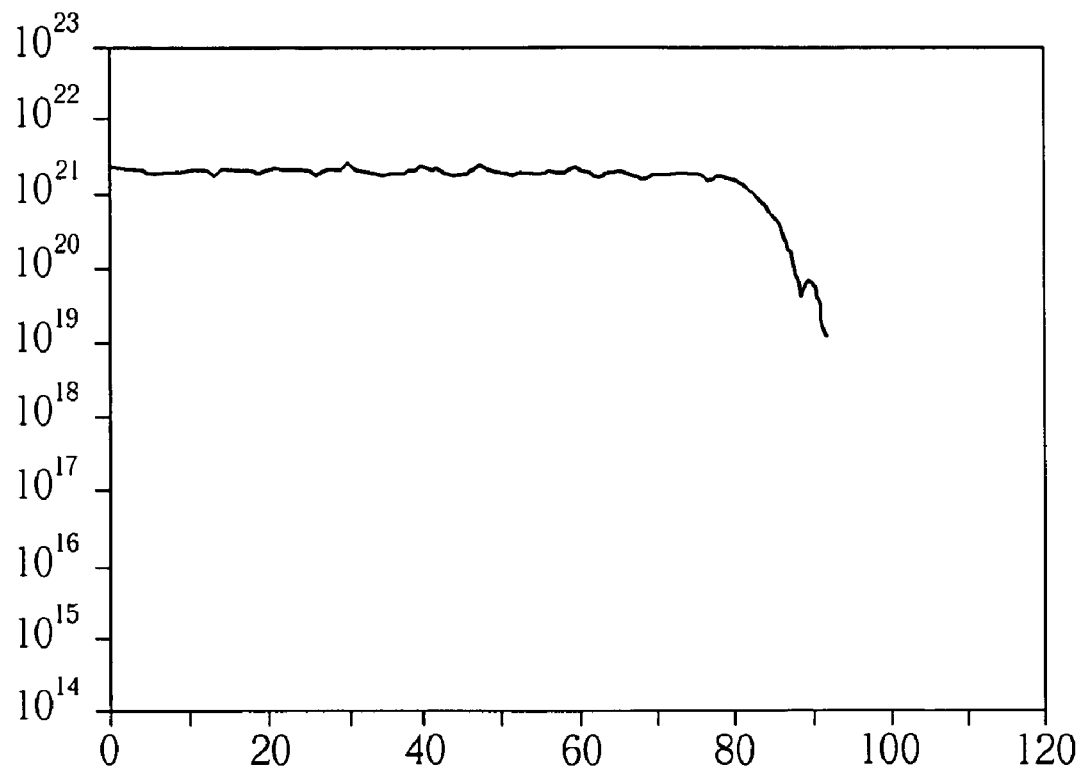
FIG. 7 is a distribution diagram illustrating the relation of the density of the first nanocrystals and the thickness of the first phosphor of the present invention.

In addition, a wavelength of the fluorescence generated by exciting the first phosphor layer 26 of this embodiment is between 400 nanometers and 700 nanometers, and the transmittance of the first phosphor layer 26 is larger than 80% when the wavelength of the light passing through the first phosphor layer 26 is between 400 nanometers and 700 nanometers. Because some of the organic materials, such as CTAB, Brij-56 and triblock copolymer pluronic P-123, will still remain in the first pores 18, a plasma step should be performed after forming the first nanocrystals 24 in the first pores for removing the remaining organic materials. The plasma step can be a process of injecting plasma of hydrogen for 0.5 hours to 3 hours at a temperature between 200° C. and 500° C. The injecting rate for the plasma of hydrogen is about 50 to 300 milliliters per minute. At this point, the first phosphor layer 26 having the first nanocrystals 24 uniformly distributed therein can be formed on the surface of the LED 12, so that the LED device 28 of the first preferred embodiment is completed. In order to clearly describe the first nanocrystals of the present invention being distributed uniformly in the first phosphor layer, please refer to FIG. 6 and FIG. 7. FIG. 6 is a cross-sectional image illustrating the first phosphor layer of the present invention pictured by a transmission electron microscopy (TEM). FIG. 7 is a schematic diagram illustrating the relation of the density of the first nanocrystals and the thickness of the first phosphor of the present invention. As shown in FIG. 6, the first nanocrystals 24 are nanocrystals having a lattice structure, and the first nanocrystals are uniformly distributed in the first porous material layer 20 of the first phosphor layer 26. The first nanocrystals 24 are arranged in a triangular formation. In addition, as shown in FIG. 7, the density of the first nanocrystals 24 from the surface of the first phosphor layer 26 to about 80 nanometers below the surface of the first phosphor layer 26, which is measured by secondary ion mass spectrometer (SIMS), are substantially the same. This means that the first phosphor layer 26 has a uniform distribution of the first nanocrystals 24.

Please refer to FIG. 4 again. The method for forming the first nanocrystals 24 in the first pores 18 of the present invention is not limited to the HDPCVD process, and the method can also be a chemical vapor deposition (CVD) process, such as atmospheric pressure chemical vapor deposition (APCVD) process, low-pressure chemical deposition (LPCVD) process or plasma enhanced chemical vapor deposition (PECVD) process etc. The temperature of the deposition process is between 100° C. and 500° C. In this embodiment, because the injecting gases are silane and hydrogen, the first nanocrystals 24 formed in the first pores 18 are silicon nanocrystals, but the first nanocrystals of the present invention are not limited to be the silicon nanocrystals. The present invention can also inject different gases to form the required nanocrystals. In addition, the first nanocrystals 24 can also be III-V group compound semiconductors, III-IV group compound semiconductors, functional groups or nonmetallic elements. The semiconductor material can be doped with other elements, such as magnesium (Mg), manganese (Mn), iron (Fe), chromium (Cr), cesium (Cs), zinc (Zn), aluminum (Al) or tin (Ti) etc. The functional group can be acetic acid or benzene etc., and the nonmetallic elements can be halogens, sulfur (S), phosphorous (P) or germanium (Ge) etc.

It should be noted that the wavelength of the fluorescence generated by exciting the first phosphor layer of the present invention can be determined according to the material of the first porous material layer 20, the aperture size of each of the first pores 18, the material of the first nanocrystals 24 and a grain size of each of the first nanocrystals 24. The grain size of each of the first nanocrystals 24 can be determined by the aperture size of each of the first pores 18 which can be controlled by adjusting the duration and the temperature of the drying process and the baking process for the colloidal film 16, so that the grain size of the first nanocrystal 24 can be controlled during the CVD process. The first phosphor layer 26 having the required fluorescence wavelength of the fluorescence can therefore be completed. In addition, during the CVD process, the first nanocrystals 24 formed in the first pores 18 are gradually formed in the first pores 18 and bonded to the first porous material layer 20, and then, the first nanocrystals 24 are gradually formed in the first pores 18. Bonding forces and energies between different materials of the first nanocrystals 24 and different materials of the first porous material layer 10 are different. In other words, interaction force and energy between the molecules of the first nanocrystals 24 and the molecules of the first porous material layer 20 can be adjusted by utilizing required materials of the first nanocrystals 24 and the first porous material layer 20, so as to have a required wavelength of the first phosphor layer 26. Besides, the bond between the first nanocrystals 24 and the first porous material layer 10 can also be adjusted by utilizing different material of the first porous material layer 20, different aperture size of each of the first pores, different grain size of each of the first nanocrystals 24 or different material of the first nanocrystals 24.

Figure 8:
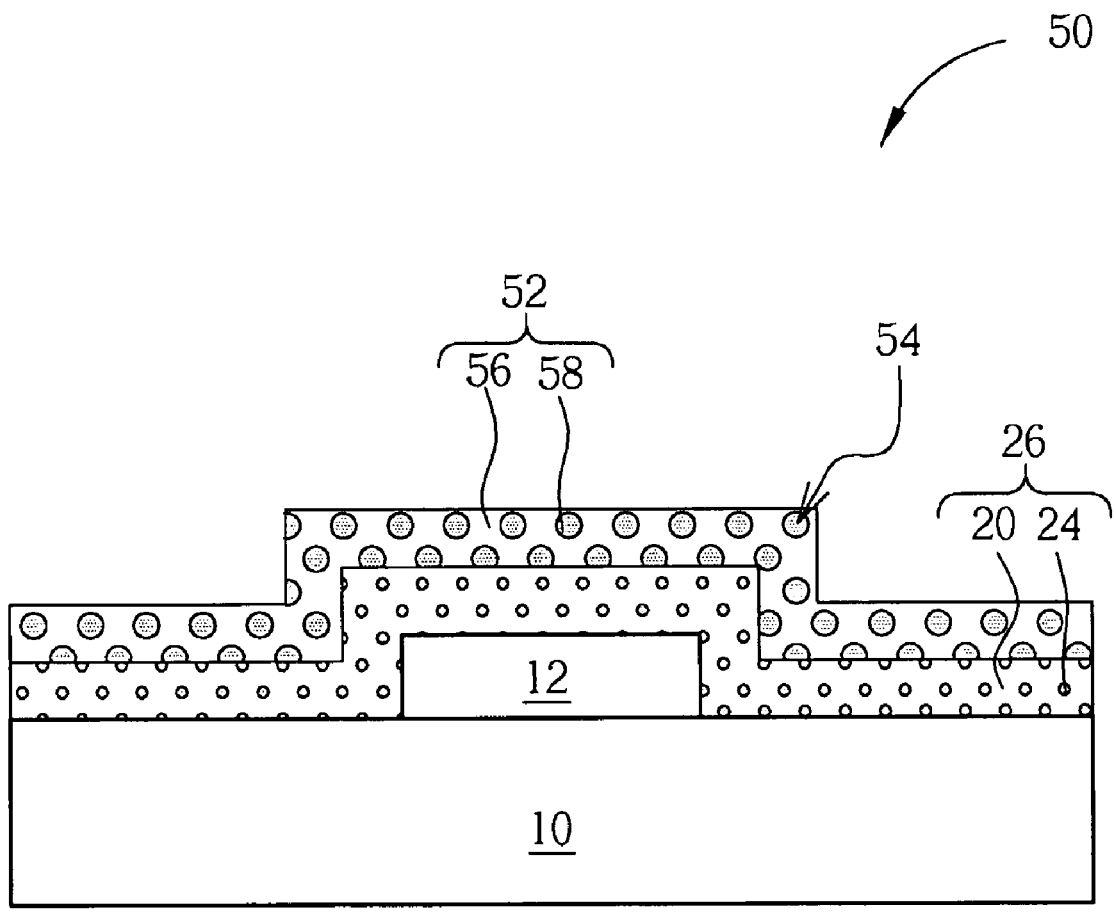
FIG. 8 is a cross-sectional schematic diagram illustrating an LED device according to a second preferred embodiment of the present invention.

The present invention is not limited to only manufacture one phosphor layer, and can manufacture a plurality of phosphor layers. Please refer to FIG. 8. FIG. 8 is a schematic diagram illustrating a manufacturing method of an LED device according to a second preferred embodiment of the present invention. As shown in FIG. 8 and compared with the first preferred embodiment, the manufacturing method of this embodiment can further comprise a step for forming at least one second phosphor layer 52 on the first phosphor layer 26, wherein the second phosphor layer 52 comprises a second porous material layer 56 with a plurality of second pores 54 and a plurality of second nanocrystals 58 disposed in the second pores 54.

According to the above-mentioned description, the present invention first forms the porous material layer with regular arrangement on the LED, and then fills the pores of the porous material layer with the material of the nanocrystals, so that the nanocrystals can be uniformly arranged in the phosphor layer. Therefore, the uniformity of the color of the LED device can be effectively raised. In addition, the porous material layer of the present invention has a transmittance higher than 90%, so that the light emitted from the LED can be prevented from being absorbed by the porous material layer while passing through the phosphor layer. Therefore, the luminous efficiency of the LED device can be raised. Furthermore, the grain size of each of the nanocrystals of the present invention is smaller than 100 nanometers, so that the light-scattering effect in the prior art phosphor layer can be avoided.

The manufacturing method according to the first preferred embodiment of the present invention manufactures an LED device according to the first preferred embodiment of the present invention. The LED device 28 includes a substrate 10, an LED 12 and a first phosphor layer 26 covering the substrate 10 and the LED 12. The LED device of the present invention is not limited to have only one phosphor layer, however. The following details various other embodiments of the present invention. In order to compare the difference between these embodiments, devices described in the following embodiments are marked with the same symbols as in the first preferred embodiment, and therefore same structures will not be detailed redundantly.

Please refer to FIG. 8 again. The manufacturing method according to the second preferred embodiment of the present invention manufactures an LED device according to the second preferred embodiment of the present invention. As shown in FIG. 8, as compared with the LED device of the first preferred embodiment, the LED device 50 of this embodiment further includes at least one second phosphor layer 52. The second phosphor layer 52 can be formed on the first phosphor layer 26 according to the above-mentioned step of forming the first phosphor layer 26 and conditions of the manufacturing processes. The second phosphor layer 52 includes a second porous material layer 56 having a plurality of second pores 54 and a plurality of second nanocrystals 58 respectively disposed in each of the second pores 54. It should be noted that the aperture of each of the second pores 54 can be different from the aperture of each of the first pores 18. The material of the second porous material layer 56 also can be different from the material of the first porous material layer 20 in order to make the wavelength of the fluorescence generated by exciting the second phosphor layer 52 different from the wavelength of the first phosphor layer 26. Accordingly, the LED device 50 of this embodiment can produce light having several color temperatures, color saturation levels and color rendering indexes. This means the light emitted from the LED device 50 can have various wavelengths. In addition, the material of the first nanocrystals 24 can also be different from the material of the second nanocrystals 58, and the grain size of each of the first nanocrystals 24 can be different from the grain size of each of the second nanocrystals 58 so as to make the first phosphor layer 26 have a different wavelength from the second phosphor layer 52. In addition, the first phosphor layer 26 and the second phosphor layer 52 can also have a same wavelength. Because the thickness of the first porous material layer 20 is limited by the process of filling the first pores 18 with silane and hydrogen, the thickness of the first phosphor layer 26 can be increased by covering the phosphor layer of the same wavelength with the first phosphor layer 26.

The intensity of the fluorescence generated by exciting the first phosphor layer 26 can also be increased.

Figure 9:
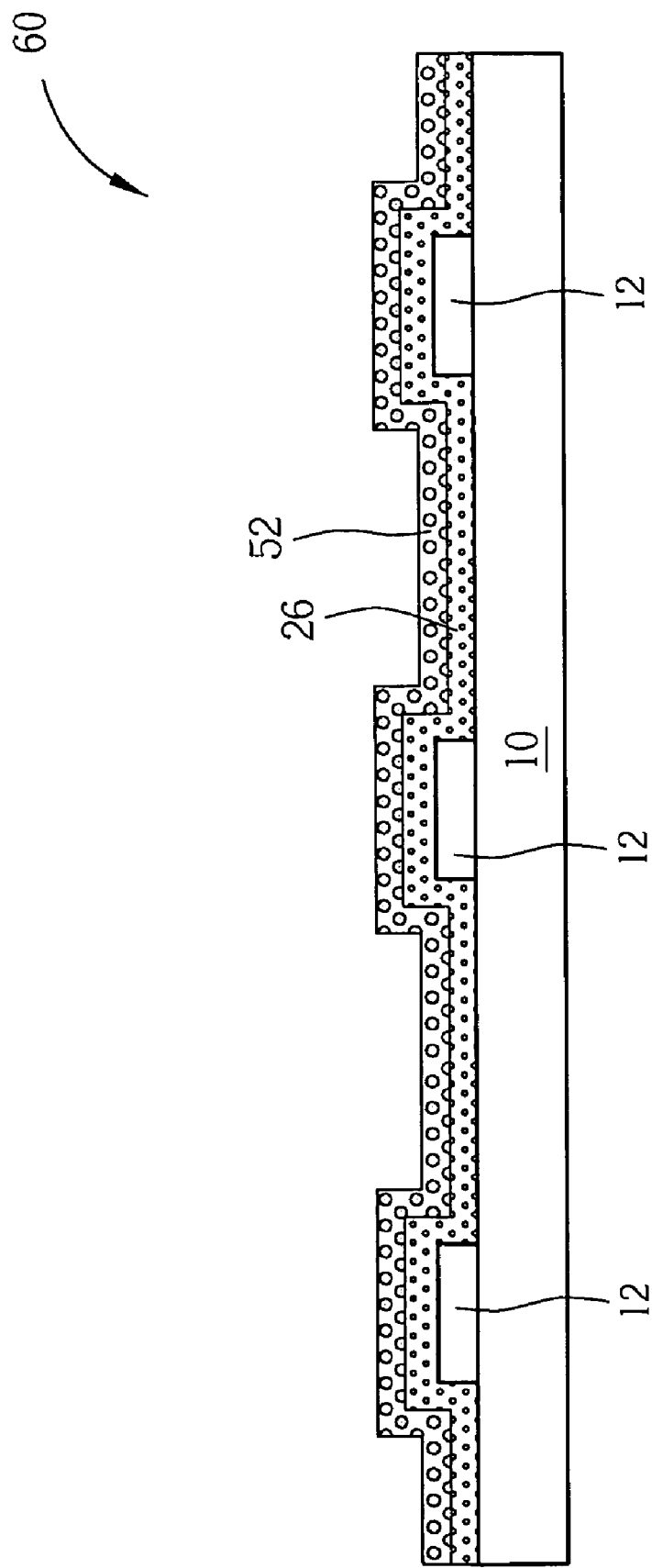
FIG. 9 is a cross-sectional schematic diagram illustrating an LED device according to a third preferred embodiment of the present invention.

In addition, the present invention is not limited to have only one LED disposed on the substrate; a plurality of the LED can be disposed on the substrate. Please refer to FIG. 9. FIG. 9 is a cross-sectional schematic diagram illustrating an LED device according to a third preferred embodiment of the present invention. As shown in FIG. 9, as compared with the LED device of the second preferred embodiment, the LED device 60 of this embodiment further includes a plurality of LEDs 12 disposed on the substrate 10.

Figure 10:
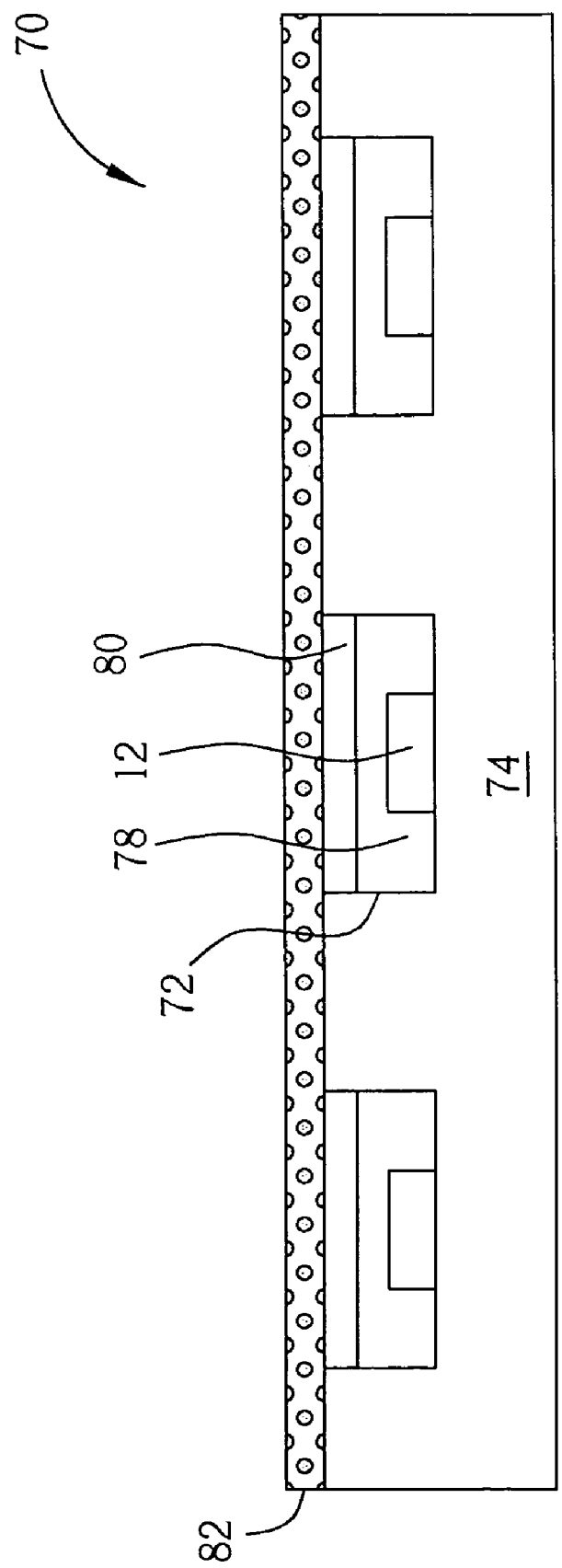
FIG. 10 is a cross-sectional schematic diagram illustrating an LED device according to a fourth preferred embodiment of the present invention.

The phosphor layer of the present invention is not limited to be directly in contact with the surface of the LED. Please refer to FIG. 10. FIG. 10 is a cross-sectional schematic diagram illustrating an LED device according to a fourth preferred embodiment of the present invention. As shown in FIG. 10, the LED 70 of this embodiment includes a substrate 74 with a plurality of trenches 72, a plurality of LEDs 12 respectively disposed in each of the trenches 72, a first transparent material layer 78 disposed in the trenches 72 and covering each LED 12, a second transparent material layer 80 disposed on the first transparent material layer 78 and filling up each trench 72, and a phosphor layer 82 covering the substrate 74 and the second transparent material layer 80. Compared to the above-mentioned embodiment, there is a first transparent material layer 78 and a second transparent material layer 80 disposed between the LEDs 12 and the phosphor layer 82. The first transparent material layer 78 and the second transparent material layer 80 can be phosphor colloid doped phosphor powders or a transparent colloid. It should be noted that the refractive index of the first transparent material layer 78 should be larger than the refractive index of the phosphor layer 82. Because the refractive index of the phosphor layer 82 is substantially 1.2, the refractive index of the first transparent material layer is between 1.2 and 1.7. The refractive index of the second transparent material layer 80 should also be smaller than the refractive index of the first transparent material layer 78. Accordingly, the total reflection ratio of the light emitted from the LED 12 can be reduced while passing through the interface between the first transparent material layer 78 and the phosphor layer 82. In addition, the second transparent material layer 80 of the present invention is not limited to be the phosphor colloid doped with phosphor powders; the second transparent material layer 80 can also be a phosphor layer having the porous material layer and the nanocrystals.

Figure 11:
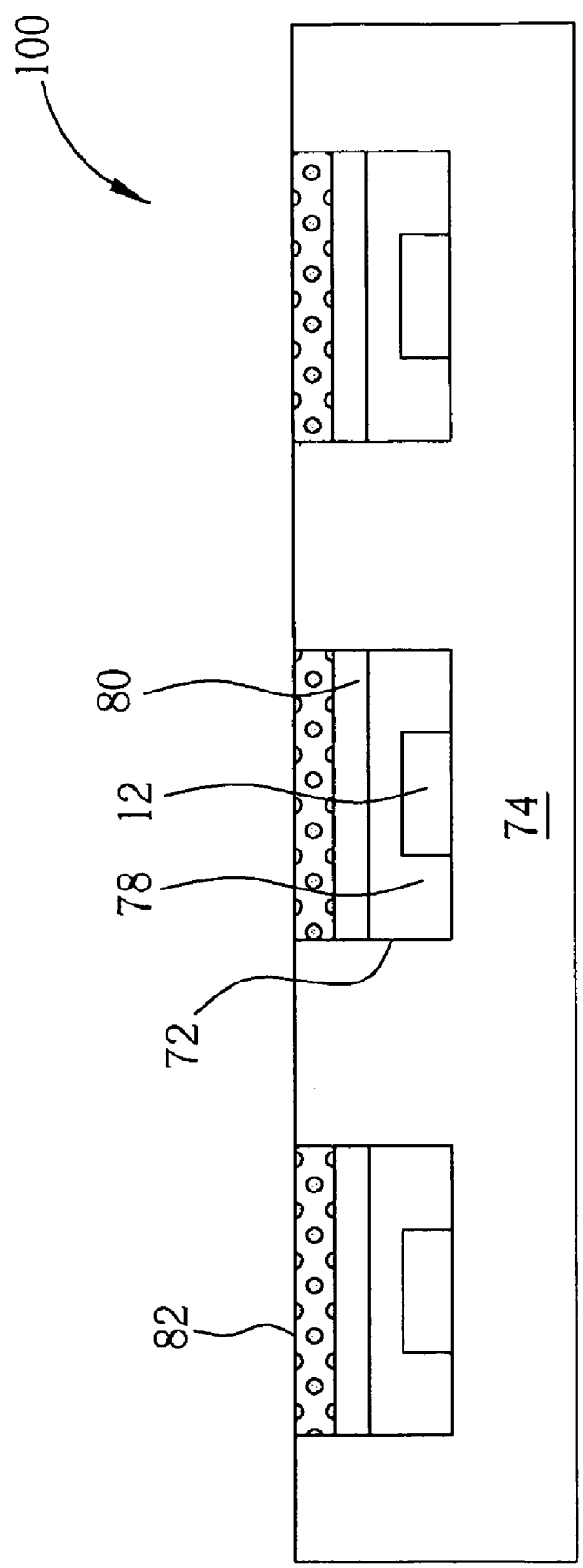
FIG. 11 is a cross-sectional schematic diagram illustrating an LED device according to a fifth preferred embodiment of the present invention.

The phosphor layer of the present invention is not limited to cover the substrate, and can also be filled into the trenches. Please refer to FIG. 11. FIG. 11 is a cross-sectional schematic diagram illustrating an LED device according to a fifth preferred embodiment of the present invention. As shown in FIG. 11, as compared with the LED device of the fourth preferred embodiment, the phosphor layer 82 in the LED device 100 of this embodiment is filled into each of the trenches 72 and disposed on the second transparent material layer 80, but is not limited to this. The stacked sequence of the phosphor layer 82 and the second transparent material layer 80 can also be exchanged. Alternatively, the phosphor layer 82 and the second transparent material layer 80 are the phosphor layers with the porous material layers and the nanocrystals.

In summary, the LED device and the manufacturing method of the present invention have several advantages described as follows:

1. The present invention forms the porous material layer with regular arrangement on the LED first, and then fills the pores of the porous material layer with the material of the nanocrystals so as to control the uniformity of the nanocrystals distributed in the phosphor layer. Therefore, the white light or the light of other colors formed by mixing the light emitted from the LED and the fluorescence emitted from the nanocrystals can be uniform. Even if several chips or a chip array are directly packaged on a circuit board, the LED device can keep the color uniform.

2. The present invention controls the aperture of the pores through controlling the duration and the temperature of the drying process and the baking process, and the aperture of the pores can control the grain size of each of the nanocrystals. Therefore, the wavelength of the fluorescence generated by exciting the nanocrystals is adjustable. The present invention can also control the material of the porous material layer and the material of the nanocrystals to have a different wavelength of the fluorescence generated by the phosphor layer through changing the bond between the nanocrystals and the porous material layer. Therefore, the phosphor layer with a single-layer or multilayer structure can be utilized to generate the light with different color temperatures, color saturation levels and color rendering indexes.

3. The present invention also provides the porous material layer and the phosphor layer having a high transmittance to reduce the light-scattering ratio and prevent the light from being absorbed again, so that the luminous efficiency can be raised.

Those skilled in the art will readily observe that numerous modifications and alterations of the device and method may be made while retaining the teachings of the invention.

What is claimed is:

1. An LED device, comprising:
   at least one LED;
   a first porous material layer, disposed on the LED, the porous material layer having a plurality of first pores;
   a plurality of first nanocrystals, disposed in the first pores, wherein a grain size of each of the first nanocrystals is smaller than an aperture of each of the first pores;
   at least one first transparent material layer, disposed between the LED and the first porous material layer; and
   at least one second transparent material layer, disposed between the first transparent material layer and the first porous material layer, where a refractive index of the second transparent material layer is smaller than the refractive index of the first transparent material.

2. The LED device of claim 1, wherein each of the first pores is pillar-shaped.

3. The LED device of claim 2, wherein the first pores are parallel to a surface of the LED.

4. The LED device of claim 3, wherein a vertical cross-section of the first pores is a formation selected from a triangular formation, a quadrangle formation and a polygon formation.

5. The LED device of claim 1, wherein the aperture of each of the first pores is smaller than 200 nanometers.

6. The LED device of claim 1, further comprising at least one second phosphor layer, the second phosphor layer comprising a second porous material layer with a plurality of second pores and a plurality of second nanocrystals disposed in the second pores.

7. The LED device of claim 6, wherein the aperture of each of the second pores is different from the aperture of each of the first pores.

8. The LED device of claim 6, wherein the material of the first nanocrystals is different from the material of the second nanocrystals.

* * * * *